US010243548B2

(12) United States Patent
Ramalingam

(10) Patent No.: US 10,243,548 B2
(45) Date of Patent: Mar. 26, 2019

(54) GATE DRIVER CIRCUIT FOR HIGH-SIDE SWITCH

(71) Applicant: Microchip Technology Incorporated, Chandler, AZ (US)

(72) Inventor: Sureshkumar Ramalingam, Coimbatore (IN)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/916,333

(22) Filed: Mar. 9, 2018

(65) Prior Publication Data

US 2018/0294805 A1     Oct. 11, 2018

(51) Int. Cl.
| | |
|---|---|
| *H03K 17/081* | (2006.01) |
| *H03K 17/06* | (2006.01) |
| *H02M 3/07* | (2006.01) |
| *H03K 17/16* | (2006.01) |
| *H03F 3/20* | (2006.01) |

(52) U.S. Cl.
CPC ........ *H03K 17/08104* (2013.01); *H02M 3/07* (2013.01); *H03K 17/063* (2013.01); *H03K 17/166* (2013.01); *H03F 3/20* (2013.01); *H03K 2217/0063* (2013.01); *H03K 2217/0081* (2013.01)

(58) Field of Classification Search
CPC .. H03K 17/08104; H03K 17/063; H02M 3/07
USPC ................ 327/108–112, 333, 427, 434, 437; 326/82, 83, 87; 323/277, 274, 908
See application file for complete search history.

(56) References Cited

U.S. PATENT DOCUMENTS

| | | | |
|---|---|---|---|
| 5,764,041 A | 6/1998 | Pulvirenti et al. | 323/282 |
| 6,275,395 B1 | 8/2001 | Inn et al. | 363/60 |
| 2005/0206444 A1 | 9/2005 | Perez | 327/540 |
| 2006/0012354 A1* | 1/2006 | Nunokawa | G05F 1/575 323/273 |
| 2009/0072803 A1* | 3/2009 | Tiew | G05F 1/573 323/277 |

OTHER PUBLICATIONS

International Search Report and Written Opinion, Application No. PCT/US2018/026703, 11 pages, dated Jun. 25, 2018.

* cited by examiner

*Primary Examiner* — Thomas Skibinski
(74) *Attorney, Agent, or Firm* — Slayden Grubert Beard PLLC

(57) ABSTRACT

A gate driver circuit for driving a high-side switch is disclosed. The gate driver circuit comprises a sample and level-shift circuit. The sample and level-shift circuit is connected to the high-side switch. The gate driver circuit further comprises a sampling capacitor. The sampling capacitor is configured to sample an output voltage of an at least one amplifier. The gate driver circuit additionally includes at least one voltage supply. The at least one voltage supply is connected to the at least one amplifier. The sampling capacitor is configured to charge a gate capacitance of the high-side switch, and the at least one amplifier is configured to limit a high-side switch output current.

18 Claims, 2 Drawing Sheets

US 10,243,548 B2

GATE DRIVER CIRCUIT FOR HIGH-SIDE SWITCH

FIELD OF THE INVENTION

The present disclosure relates to transistor-based switches and, more particularly, to a gate driver circuit for a high-side switch.

APPLICATION PRIORITY

The present application claims priority to Indian Application No. 201711012739, filed Apr. 10, 2017, the contents of which are hereby incorporated in their entirety.

BACKGROUND

High-side switches can be used to drive a variety of loads, and therefore can be used in a number of different applications. Typical systems and methods for driving a high-side switch utilize a charge-pump. A charge-pump is a DC to DC converter that uses capacitors as energy-storage elements to create either a higher- or lower-voltage power source. In regards to high-side switches, the charge-pump is relied on to supply other circuit components (such as amplifiers) in addition to supplying a DC current for driving the high-side switch. This method necessitates the use of large capacitors within the charge-pump to supply DC load currents. Large capacitors can take up valuable surface area if an on-chip integrated solution is required. To solve this problem, some systems implement external capacitors for supplying the DC current. While this reduces the required surface area of the chip, extra pins are then included to connect the external capacitors. Using a charge-pump design for driving a high-side switch is not conducive to situations that require a reduced chip size or situations that are cost sensitive and therefore require a reduced number of pins. Additionally, using a charge-pump design is not conducive to situations that require as few external components as possible, such as external capacitors, because the external components also add to the overall bill of materials (BOM) and cost.

Generally speaking, high-side switches include three main elements: a pass element, a gate-control block, and an input logic block. The pass element is usually a transistor which is typically a metal-oxide-semiconductor field-effect transistor (MOSFET) or a laterally diffused metal oxide semiconductor transistor (LDMOS). An LDMOS transistor is considered to be a type of MOSFET. The pass element operates in the linear region to pass the current from a power source to a load. The gate-control block provides a voltage to the gate of the pass element to switch it "on" or "off." The input logic block interprets the on/off signal and triggers the gate control block to switch the pass element "on" or "off."

FIG. 1 is a circuit-level schematic of a known system and method for driving a high-side switch. As shown, a charge-pump 2 is connected to a current controller 4. The current controller 4 includes an amplifier 6 and a transistor 10. Here, the transistor 10 used is a p-channel metal-oxide semiconductor (pMOS). The current controller 4 is supplied by the charge-pump 2 and controls an output based on the voltage difference resulting from the current controller input pins. The positive rail of the amplifier 6 is powered by the charge-pump 2 and the negative rail of the amplifier 6 is powered by a supply voltage 8. A current sensing resistor 12 is connected between the charge-pump 2 and the amplifier 6. A current-sensing FET 14 is connected between the amplifier 6 and an output pin 18. A high-side switch FET 16 has the drain side connected to the charge-pump 2, the gate side is connected to the output of the amplifier 6, via transistor 10, and the source side is connected to the output pin 18. The output pin 18 is used to connect the system to a circuit load 20. Additionally, a resistor 32 is connected between the gate side and the source side of the high-side switch FET 16. The circuit further includes a clock generator 22. A resistor 24 is connected between the charge-pump 2 and the amplifier 6. The circuit further includes a load reference 26. Also shown, a FET 28 is connected in series with a resistor 30 for when the high-side switch FET 16 is turned "off."

Still referring to FIG. 1, the charge-pump 2 needs to deliver a significant output current due to its connection to the amplifier 6 and the high-side switch FET 16. Obtaining a full $V_{GS}$ with the amplifier 6 may be difficult when the circuit load 20 is large. Therefore, the charge-pump 2 includes relatively large capacitors, making it difficult to integrate the circuit of FIG. 1 onto a single chip. Should the large capacitors be externally located, additional pins become necessary, and any external capacitors may increase the BOM cost, therefore increasing the cost of the overall system.

Therefore what is needed is an improved system and method for driving a high-side switch.

SUMMARY

The preceding needs are met via the presently disclosed system and method for driving a high-side switch including a sampling and level-shift circuit.

An exemplary gate driver circuit for driving a high-side switch is disclosed. The gate driver circuit comprises a sample and level-shift circuit. The sample and level-shift circuit is connected to the high-side switch. The gate driver circuit further comprises a sampling capacitor. The sampling capacitor is configured to sample an output voltage of an at least one amplifier. The gate driver circuit additionally includes at least one voltage supply. The at least one voltage supply is connected to the at least one amplifier. The sampling capacitor is configured to charge a gate capacitance of the high-side switch, and the at least one amplifier is configured to limit a high-side switch output current.

An exemplary method for driving a high-side switch is disclosed. The method includes supplying at least one voltage to an at least one amplifier. Further, the method includes limiting an output current of the high-side switch via an at least one amplifier. The method additionally includes sampling an output voltage of the at least one amplifier. A sampling capacitor is configured for the sampling of the output voltage. The method includes level-shifting the output voltage of the at least one amplifier. Additionally, the method includes charging a gate capacitance of the high-side switch using the sampling capacitor.

DETAILED DESCRIPTION

Figure 1:
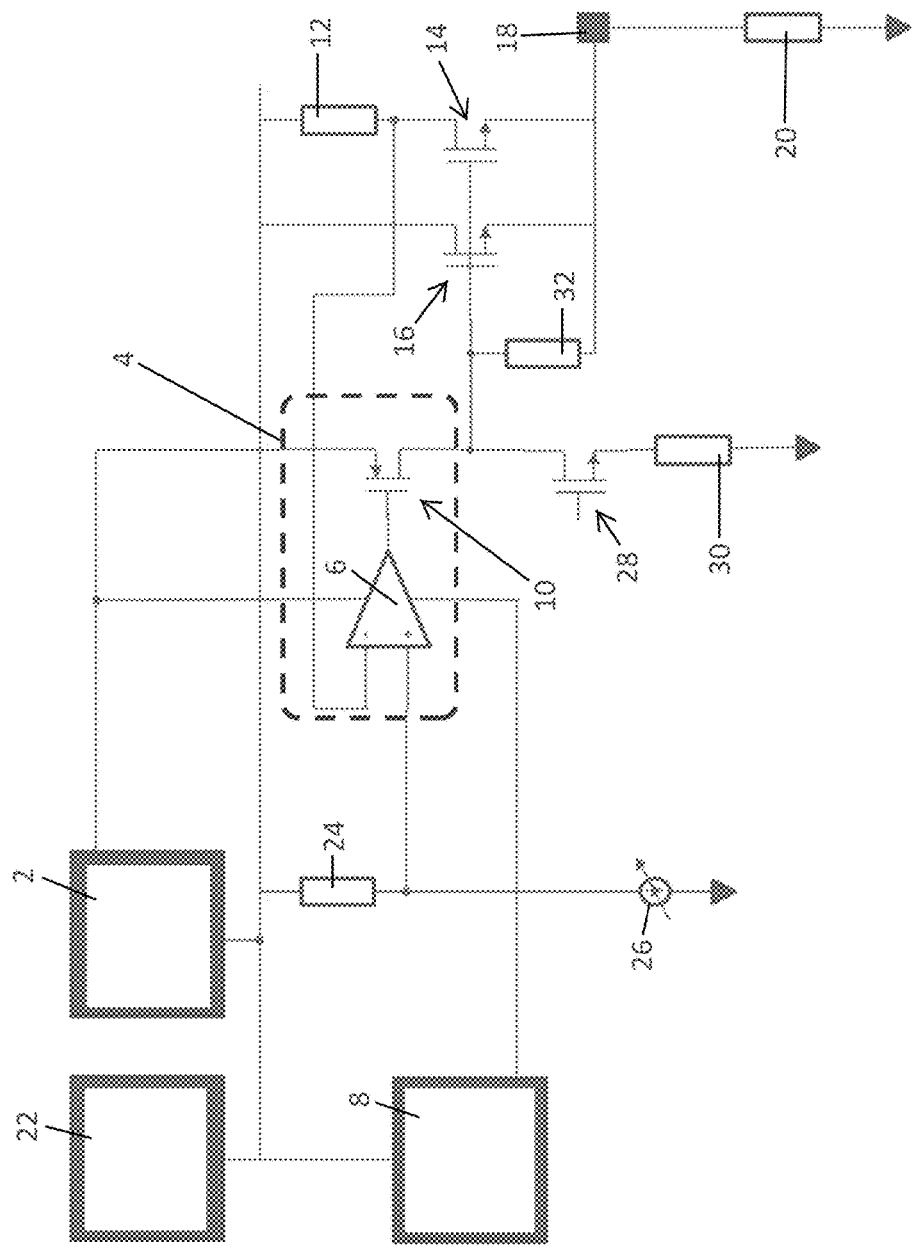
FIG. 1 is a circuit-level schematic of a known system and method for driving a high-side switch.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives that fall within the scope of embodiments of the invention.

Embodiments of the present disclosure provide a system and a method for driving a high-side switch for use in selectively providing power to an output load.

Figure 2:
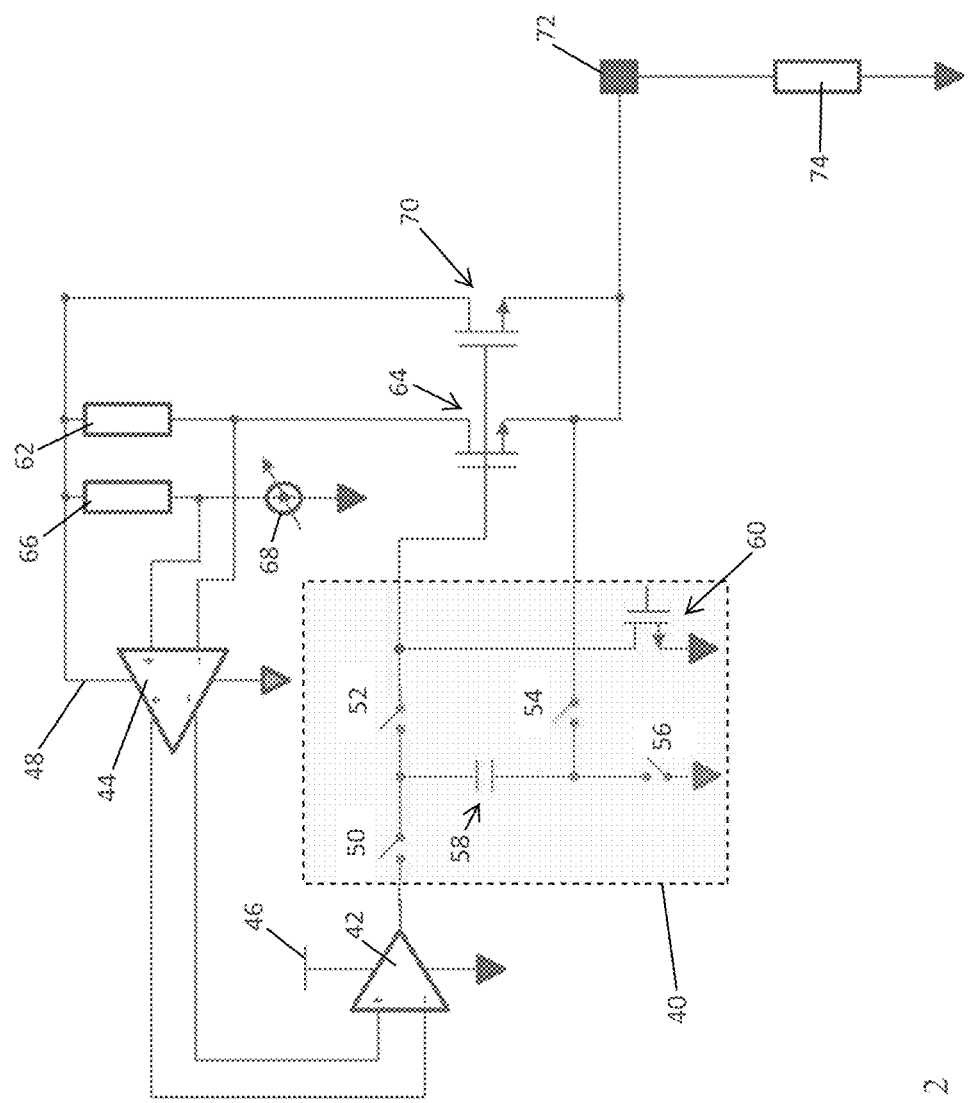
FIG. 2 is a circuit-level schematic of one embodiment of a system and method for driving a high-side switch in accordance with the present disclosure.

FIG. 2 is a circuit-level schematic of one embodiment of a system and method for driving a high-side switch in accordance with the present disclosure. In one embodiment, a sample and level-shift circuit 40 may be provided. The sample and level-shift circuit 40 may be connected to the output of an amplifier 42. The input of the amplifier 42 may be connected to the output of an amplifier 44. The amplifier 42 may be connected to a voltage supply 46. Further, the amplifier 44 may be connected to a voltage supply 48. The sample and level-shift circuit 40 may include a plurality of switches 50, 52, 54, 56. The sample and level-shift circuit 40 may further include a sampling capacitor 58. Additionally, the sample and level-shift circuit 40 may include a field-effect transistor (FET) 60. The voltage supply 48 may be connected to a resistor 62, and the resistor 62 may be connected in series with a transistor 64. One output of the sample and level-shift circuit 40 may be connected to the source side of the transistor 64. Further, the same output may be connected to the source side of a high-side switch 70 and an output pin 72.

In one non-limiting example, as shown by FIG. 2, the high-side switch 70 may be an n-channel metal-oxide semiconductor field-effect transistor (nMOS transistor) or an n-channel laterally diffused metal oxide semiconductor transistor (nLDMOS transistor). An nLDMOS transistor is considered to be a type of nMOS transistor. In certain situations, it may be beneficial to use a different type of transistor. Another output of the sample and level-shift circuit 40 may be connected to the gate side of the high-side switch 70. The drain side of the high-side switch 70 may be connected to the voltage supply 48. The high-side switch 70 may be connected in parallel to the resistor 62 in series with the transistor 64. The circuit may further include a resistor 66 connecting the voltage supply 48 to an input of the amplifier 44. The resistor 62 may connect the voltage supply 48 to another input of the amplifier 44. The resistor 66 may be connected to a load reference 68. The output pin 72 may be connected to a circuit load 74. In certain non-limiting embodiments, a low-side switch may be included and connected to the output pin 72, such that the high-side switch 70 and the low-side switch constitute a half-bridge configuration.

Still referring to FIG. 2, the sample and level-shift circuit 40 may eliminate a need for a charge-pump when driving the high-side switch 70. The sampling capacitor 58 may sample the voltage at the output of the amplifier 42. The sampling capacitor 58 may then be used to charge the gate side capacitance of the high-side switch 70. The charging of the gate side capacitance may enable the high-side switch 70 to turn "on." In one non-limiting embodiment, when the high-side switch 70 is "on," an input voltage may be supplied to the circuit load 74.

In another non-limiting embodiment, the gate capacitance of the high-side switch 70 may serve as a holding capacitor. Accordingly, there may be no DC loading required for a holding capacitor. The sample and level-shift circuit 40 may not provide any DC current.

In certain non-limiting embodiments, the voltage supplies 46, 48 may supply a fixed voltage to the amplifiers 42, 44, as opposed to having a charge-pump power amplifiers. Alternatively, the voltage supplies 46, 48 may supply varying voltage to the amplifiers 42, 44. In one non-limiting embodiment, the voltage supplies 46, 48 may be configured to increase the respective supplied voltages over a predetermined time (i.e. ramp voltage). The amplifiers 42, 44 may serve as short-circuit current controllers. In certain situations, it may be beneficial to use different amplifier configurations, or a different type of amplifier. In certain situations, it may be beneficial to use an operational amplifier for the amplifiers 42, 44. In certain situations, it may be beneficial to include an amplifier 42, 44 that is configured to function within a common mode voltage range from supply voltage 48 down to several volts below the supply voltage 48. The amplifiers 42, 44 may be specifically designed to handle a high input common mode voltage as well as a low output common mode voltage.

In certain situations, it may be beneficial to include a voltage supply 46, 48 that provides 3.3 volts. Alternatively, the voltage supplies 46, 48 may supply any other predetermined voltage level, including 12 volts and 14 volts. In certain situations, it may be beneficial to use a vehicle battery for at least one of the voltage supplies 46, 48. In certain situations, it may be beneficial have at least one of the voltage supplies 46, 48 have a supply voltage within the range of 4.5 volts to 60 volts.

In some non-limiting embodiments, the resistor 62 may be a current-sensing resistor. Additionally, the transistor 64 may be a current-sensing FET.

In one non-limiting embodiment, the disclosed system may be an integrated circuit on a single chip. The integrated circuit may use ⅓ of the chip surface area used by the charge-pump system as shown by FIG. 1. Alternatively, the disclosed system may use up to 99% of the chip surface area used by the charge-pump system as shown by FIG. 1. In certain situations, it may be beneficial to specifically include the sampling capacitor 58 within the integrated circuit on a single chip. In one non-limiting embodiment, the sampling capacitor 58 may be smaller than the capacitors associated with the charge-pump system shown by FIG. 1. In some non-limiting embodiments, the sampling capacitor may be within a capacitance range of 2 pF to 250 pF.

In one non-limiting embodiment, the number of pins included by the present disclosure may be less than the number of pins included by the charge-pump system as shown by FIG. 1. In one non-limiting example, the present disclosure may include one less pin than the charge-pump system as shown by FIG. 1. In another non-limiting example, the present disclosure may include up to three fewer pins than the charge-pump system as shown by FIG. 1.

The amplifier 42 may be powered by a voltage supply 46. Similarly, the amplifier 44 may be powered by a voltage supply 48. In some situations, it may be beneficial to have at least one of the voltage supplies 46, 48 supply a fixed voltage.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

What is claimed is:

1. A gate driver circuit for driving a high-side switch, the gate driver circuit comprising:
    a sample and level-shift circuit, the sample and level-shift circuit connected to the high-side switch;
    a sampling capacitor, the sampling capacitor configured to sample an output voltage of an amplifier; and
    a voltage supply, the voltage supply connected to the amplifier;
    wherein:
        the sampling capacitor is further configured to charge a gate capacitance of the high-side switch; and
        the amplifier is configured to limit a high-side switch output current.

2. The gate driver circuit of claim 1, wherein the high-side switch is an n-channel metal-oxide semiconductor field-effect transistor (nMOS transistor).

3. The gate driver circuit of claim 2, further comprising a circuit load, the circuit load connected to a source side of the nMOS transistor.

4. The gate driver circuit of claim 1, wherein the amplifier is configured to function within a common mode voltage range, the common voltage range between a second voltage and a voltage of the voltage supply, the second voltage being less than the voltage of the voltage supply.

5. The gate driver circuit of claim 1, wherein the sampling capacitor is within a capacitance range of 2 pF to 250 pF.

6. The gate driver circuit of claim 1, wherein the gate driver circuit is an integrated circuit on a single chip.

7. The gate driver circuit of claim 1, further comprising a current sensing resistor connected in series with a transistor, wherein the current sensing resistor and the transistor are connected in parallel with the high-side switch.

8. A method for driving a high-side switch, the method comprising:
    supplying a supply voltage to an amplifier;
    limiting an output current of the high-side switch via the amplifier;
    sampling an output voltage of the amplifier with a sampling capacitor configured for the sampling of the output voltage;
    level-shifting the output voltage of the amplifier; and
    charging a gate capacitance of the high-side switch using the sampling capacitor.

9. The method of claim 8, further comprising supplying an input voltage to a load when the high-side switch is turned on.

10. The method of claim 8, wherein the high-side switch is an n-channel metal-oxide semiconductor field-effect transistor (nMOS transistor).

11. The method of claim 8, further comprising operating the amplifier within a common mode voltage range, the common mode voltage range between a second voltage and a voltage of a voltage supply supplying the supply voltage, the second voltage being less than a voltage of the voltage supply.

12. A circuit, comprising:
    a high-side switch; and
    a gate driver circuit for driving the high-side switch, the gate driver circuit comprising:
        a sample and level-shift circuit, the sample and level-shift circuit connected to the high-side switch;
        a sampling capacitor, the sampling capacitor configured to sample an output voltage of an amplifier; and
        a voltage supply, the voltage supply connected to the amplifier; wherein:
            the sampling capacitor is further configured to charge a gate capacitance of the high-side switch; and
            the amplifier is configured to limit a high-side switch output current.

13. The gate driver circuit of claim 12, wherein the high-side switch is an n-channel metal-oxide semiconductor field-effect transistor (nMOS transistor).

14. The gate driver circuit of claim 13, further comprising a circuit load, the circuit load connected to a source side of the nMOS transistor.

15. The gate driver circuit of claim 12, wherein the amplifier is configured to function within a common mode voltage range, the common mode voltage range between a second voltage and the voltage supply, the second voltage being less than a voltage of the voltage supply.

16. The gate driver circuit of claim 12, wherein the sampling capacitor is within a capacitance range of 2 pF to 250 pF.

17. The gate driver circuit of claim 12, wherein the gate driver circuit is an integrated circuit on a single chip.

18. The gate driver circuit of claim 12, further comprising a current sensing resistor connected in series with a transistor, wherein the current sensing resistor and the transistor are connected in parallel with the high-side switch.

* * * * *

UNITED STATES PATENT AND TRADEMARK OFFICE
CERTIFICATE OF CORRECTION

PATENT NO. : 10,243,548 B2
APPLICATION NO. : 15/916333
DATED : March 26, 2019
INVENTOR(S) : Sureshkumar Ramalingam et al.

It is certified that error appears in the above-identified patent and that said Letters Patent is hereby corrected as shown below:

On the Title Page

Please Insert the following:
--(30) Foreign Application Priority Data
Apr. 10, 2017 (IN) ..............................201711012739--

Signed and Sealed this
Eighteenth Day of June, 2019

Andrei Iancu
*Director of the United States Patent and Trademark Office*